United States Patent [19]
Cho

[11] Patent Number: 6,066,976
[45] Date of Patent: May 23, 2000

[54] APPARATUS AND METHOD FOR IMPROVED DYNAMIC RANGE

[75] Inventor: Jeffrey C. Cho, Natick, Mass.

[73] Assignee: MKS Instruments, Inc., Andover, Mass.

[21] Appl. No.: 09/056,979

[22] Filed: Apr. 8, 1998

[51] Int. Cl.[7] .............................. G06F 7/556; G06F 7/12
[52] U.S. Cl. ..................... 327/350; 327/351; 327/337; 327/512
[58] Field of Search .................................. 327/350, 341, 327/360, 351, 337, 131, 512, 513; 324/76.23, 76.24

[56] References Cited

U.S. PATENT DOCUMENTS

| | | | |
|---|---|---|---|
| 3,879,668 | 4/1975 | Edwards | 327/350 |
| 3,971,984 | 7/1976 | Bench | 324/132 |
| 4,122,529 | 10/1978 | Hoech | 327/350 |
| 4,408,128 | 10/1983 | Fujita | 324/65 |
| 5,241,282 | 8/1993 | Poole | 327/350 |

*Primary Examiner*—Dinh T. Le
*Attorney, Agent, or Firm*—McDermott, Will & Emery

[57] ABSTRACT

A logarithmic amplifier is provided with a calibration circuit to allow for current measurement over a wide-dynamic range that includes extremely low current levels in a manner which mitigates or eliminates sensitivity to temperature. Calibration currents are generated by application of a series of voltage ramps of selectable slope to a capacitor. This provides a set of known current levels, selectable over a range of decades, for periodic calibration of the logarithmic amplifier. The selectable calibration currents can also be advantageously used to provide a fixed, known bias current to the input of the logarithmic amplifier to improve the response time of the amplifier for measurement of small sensor currents on the order of 10–100 fA.

21 Claims, 7 Drawing Sheets

|  | BIAS CURRENT LEVEL | | | | |
|---|---|---|---|---|---|
|  | 1pA | 10pA | 100pA | 1nA | 10nA |
| 10nA TIME |  |  | 0.5ms | 0.5ms | 0.5ms |
| 1nA TIME |  | 5ms | 0.5ms | 0.5ms |  |
| 100pA TIME | 50ms | 5ms | 5ms |  |  |
| 10pA TIME | 50ms | 50ms |  |  |  |
| 1pA TIME | 0.5sec |  |  |  |  |
| MEASURE/AVG TIME | 0.4sec | 39ms | 3ms | 0.5ms | 0.1ms |
| RF/DC SETTLE TIME | 1ms | 1ms | 1ms | 1ms | 1ms |
| TOTAL TIME | 1sec | 0.1sec | 10ms | 2.5ms | 1.6ms |

STEP CURRENT LEVEL AND DURATION

*FIG. 8*

APPARATUS AND METHOD FOR IMPROVED DYNAMIC RANGE

BACKGROUND OF THE INVENTION

Electrometers employ circuits which measure current over a wide range and at extremely low levels. For example, mass spectrometers employ current sensors having eight decades of coverage ranging from less than 0.1 pA to 10.0 μA. Feedback amplifiers are commonly employed to convert the sensed current measurement to a voltage measurement. The voltage is applied to an analog to digital (A/D) converter, the output of which is processed by a computer to generate a desired output.

The most straightforward means for measuring current is an operational amplifier (hereinafter "op-amp") feedback configuration which employs a resistor R as a feedback element as shown in FIG. 1A. The operational amplifier 30 includes a negative feedback terminal 32A, a positive feedback terminal 32B, and an output terminal 34. Resistor R is coupled across the output terminal 34 and negative feedback terminal 32A, thereby providing a feedback loop. The positive feedback terminal 32B is grounded as shown. In this manner, the output voltage $V_o$ is related to the input current $I_{in}$ according to the following relationship:

$$V_o = I_{in}R. \qquad (1)$$

Such a configuration requires a large resistor R for measurement of small levels of current; however large resistors are a source for thermal noise. In addition, stray capacitance inherent in the op-amp 40 and resistor R in conjunction with a high value resistor R can lead to an impractically-large time constant.

The dynamic range of such a configuration is limited by the use of a single resistor R. When large current values are to be measured, a small value resistor R is required or else the voltage at the output $V_o$ will saturate, i.e., $V_o$ will match the source voltage levels applied to the op-amp 30. A resistor bank including resistors $R_a$, $R_b$, $R_c$ and physical switches $S_a$, $S_b$, $S_c$ provides selectable resistance levels. Such a configuration is undesirable, as switches with minimal leakage current are sophisticated and therefore expensive. A further limitation of this configuration is that it requires a high-resolution analog-to-digital converter 56 to obtain accurate low-level current measurements, in the case where few resistors are used in the resistor bank.

An integrator amplifier as shown in Prior Art FIG. 1B employs a capacitor C as the feedback element. This circuit integrates the input signal $I_{in}$ to provide an output voltage $V_o$. In this embodiment, the relationship is characterized as:

$$\frac{dV_o}{dt} = \frac{I_{in}}{C}. \qquad (2)$$

As capacitor C charges, the voltage across the capacitor ramps upward or downward, depending on the direction of the applied current $I_{in}$. The slope of the ramp $dV_o/dt$ varies with the level of applied input current $I_{in}$. The output voltage $V_o$ is measured for a predetermined time interval to provide the degree of the slope, and a corresponding input current $I_{in}$ is determined based on that value. A reset switch S periodically discharges the capacitor C to prevent saturation of the output voltage $V_o$.

The integrator embodiment mitigates the thermal noise problem; however it suffers from several limitations. A small capacitor C is required for small current measurement; for example, if measurements on the order of 1 pA are required, a small capacitor C, for example a 1 pA capacitor, is employed. Such a small capacitance is nearly equal to the parasitic capacitance of the op-amp 30, which varies with the input signal and is sensitive to temperature. This embodiment is further limited by leakage current through the op-amp when the switch S is open. To achieve wide-dynamic range, a bank of capacitors are required, and therefore a switch is required to select a capacitance level. This introduces the imitations described above in the FIG. 1A embodiment. The primary limitation of this embodiment lies in that field effect transistors (FETs) are commonly used for the reset switch S, which tends to introduce further leakage current, adversely affecting signal measurements.

A logarithmic amplifier, as shown in Prior Art FIG. 1C employs a diode D as the feedback element for the op-amp 30. The transfer function for this embodiment is given by:

$$V_o = \frac{kT}{q}\ln\left(\frac{I_{in}}{I_s}\right) \qquad (3)$$

where k is the Boltzman time constant, T is temperature in Kelvin, q is the electron charge, $I_{in}$ is the input current, and $I_s$ is the reverse saturation current (diode-dependent, usually on the order of $10^{-15}$ A). A second diode $D_1$ is included to allow for bipolar transmission.

The logarithmic amplifier embodiment takes advantage of the logarithmic relationship between output voltage $V_o$ and input current $I_{in}$ introduced by the diodes $D_1$, $D_2$, to offer a significant improvement in dynamic range over the aforementioned embodiments. However, it suffers from the limitation of extreme temperature sensitivity, due to the dependence of the transfer function on T, but especially due to the exponential temperature-dependency of the reverse saturation current factor $I_s$. For example, the temperature coefficient causes an output voltage $V_o$ variance at a rate of approximately −2.1 mV/°C. near room temperature. This results in a decade variance in $V_o$ when the operating temperature changes by 30° C.

To avoid this problem, some have employed a differential log measurement to cancel the temperature dependency of $I_s$, which provides a certain level of improvement. The temperature of the circuit can be stabilized; however, this is an expensive solution, which proves to be impractical for many applications.

As illustrated in the schematic diagram of Prior Art FIG. 1D, others have employed a calibration technique which periodically provides a known reference current $I_{ref}$ to the amplifier 30, and measures the resulting output voltage $V_o$. By taking data over a range of reference current levels $I_{ref}$, a calibration chart can be generated and used to correct sensor measurements; thus, rendering the amplifier insensitive to temperature.

To generate the known reference current values $I_{ref}$, a switchable resistor bank 31, including resistors $R_A$, $R_B$, $R_N$, and corresponding switches $S_A$, $S_B$, $S_N$, has been employed in combination with a reference voltage source $V_{ref}$. Such a configuration introduces leakage current at the switches $S_A$, $S_B$, $S_N$, and, more significantly, generates a large reference current $I_{ref}$ error due to DC offset error at the op-amp 30, which can lead to excessive error when measuring low current levels. For example, when introducing reference current $I_{ref}$ levels on the order of 1 pA, to generate the 1 pA reference current, a 1 GΩ resistor is required assuming an input voltage of 1 mV. Assuming a DC offset in the op-amp 30 of 1 mV (a common DC offset error in electrometer grade op-amps), this would lead to an error factor of 100 percent. Therefore, in this configuration, when the offset error of the op-amp 30 approaches the input voltage $V_{ref}$, the resultant error in the input current $I_{ref}$ is significant, limiting performance of the circuit.

SUMMARY OF THE INVENTION

The present invention is directed to an apparatus and method for current measurement over a wide-dynamic range that includes extremely low levels, in a manner which overcomes the limitations of the prior art. In particular, the present invention provides a logarithmic amplifier configuration which mitigates and/or eliminates sensitivity to temperature.

Calibration currents are generated by application of a voltage ramp of selectable slope to a capacitor. This provides a range of known selectable current levels for periodic calibration of the logarithmic amplifier. The selectable current levels can also be advantageously used to provide a fixed bias current to the input of the logarithmic amplifier for improving the response time of the amplifier for small sensor current measurements.

The present invention offers temperature-independent, accurate measurement of current over at least nine decades of coverage, for example 10 fA–10 μA. No resistor banks, or capacitor banks are required. Furthermore, DC offset error introduced in the generation of reference current is greatly reduced or eliminated.

In a first embodiment, the present invention is directed to an apparatus comprising a logarithmic amplifier for generating an output voltage as a logarithmic function of a reference current. An integrator amplifier generates a ramp voltage as a function of input current received at an input. A capacitor coupled in series between the output of the integrator amplifier and the input of the logarithmic amplifier converts the ramp voltage to a reference current. When the reference current is applied to the logarithmic amplifier, a corresponding output voltage is generated. The output voltage is a logarithmic function of the reference current.

In a first preferred embodiment, a series of known reference currents are generated by the integrator amplifier and capacitor. The reference currents are periodically applied to the logarithmic amplifier, for example following a significant temperature change. The corresponding set of output voltages are stored to provide a calibration function which characterizes the response of the logarithmic amplifier. In this manner, the response of the logarithmic amplifier is rendered insensitive to temperature.

In a second preferred embodiment, the reference current generated by the integrator amplifier and capacitor is applied as a bias current and added to sensor current input at the logarithmic amplifier to improve the response time of the logarithmic amplifier.

In a third preferred embodiment, a sequence of reference current steps are generated by the integrator amplifier and capacitor and periodically applied as a boost current to assist in the recovery of the circuit from periodic current spikes injected into the logarithmic amplifier when the integrator amplifier undergoes a reset operation.

In a fourth preferred embodiment, the reference current generated by the integrator amplifier produces a known slew rate in the output voltage. A sensor current is applied to the reference current which modulates the slew rate. The sensor current is determined by monitoring the degree of modulation in slew rate. This embodiment is especially applicable to measurement of small sensor circuit values.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8 is a chart illustrating preferred steps for assisting recovery of output voltage $V_{o2}$ in accordance with the present invention.

DETAILED DESCRIPTION OF PREFERRED EMBODIMENTS

The present invention is directed to a method and apparatus for calibrating a logarithmic amplifier in a manner which mitigates and/or eliminates sensitivity to temperature. As an added benefit, the present invention improves sensitivity and response time for measurement of small sensor current levels, i.e., on the order of 10 fA.

Figure 1A:
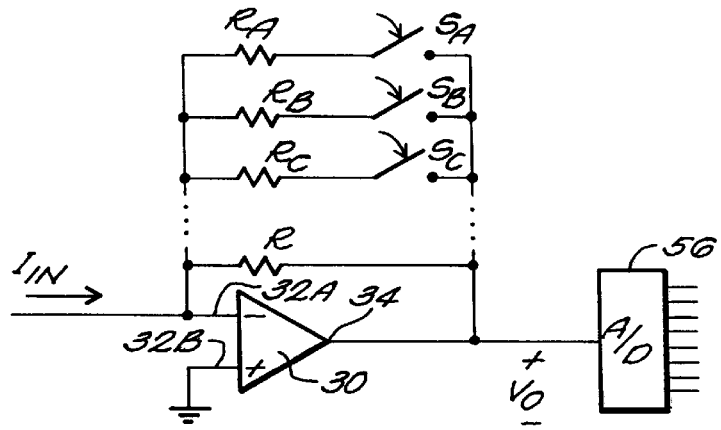
FIG. 1A is schematic representation of a prior art feedback amplifier employing a resistor R as a feedback element.
Figure 1B:
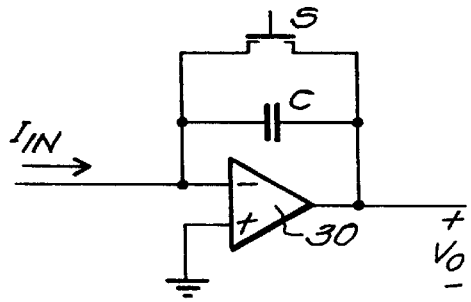
FIG. 1B is a schematic illustration of a prior art integrator amplifier employing a capacitor C as a feedback element.
Figure 1C:
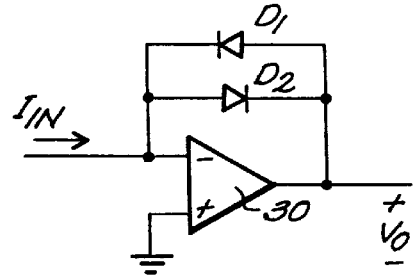
FIG. 1C is a schematic illustration of a prior art logarithmic amplifier employing a diode D as a feedback element.
Figure 1D:
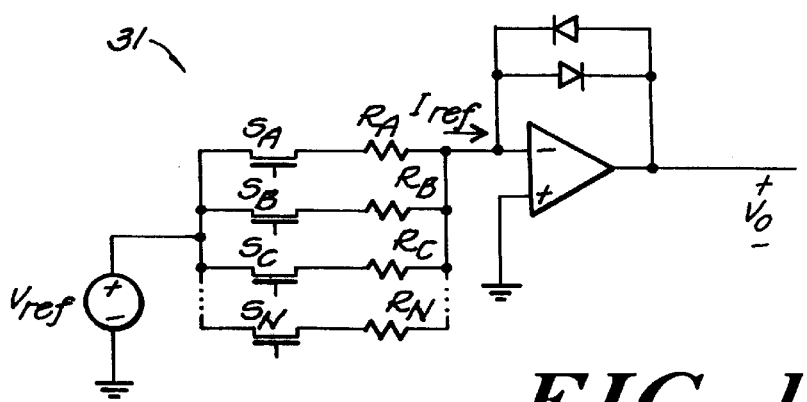
FIG. 1D is a schematic illustration of a prior art technique for calibration of the logarithmic amplifier of FIG. 1C using known reference current values.
Figure 2:
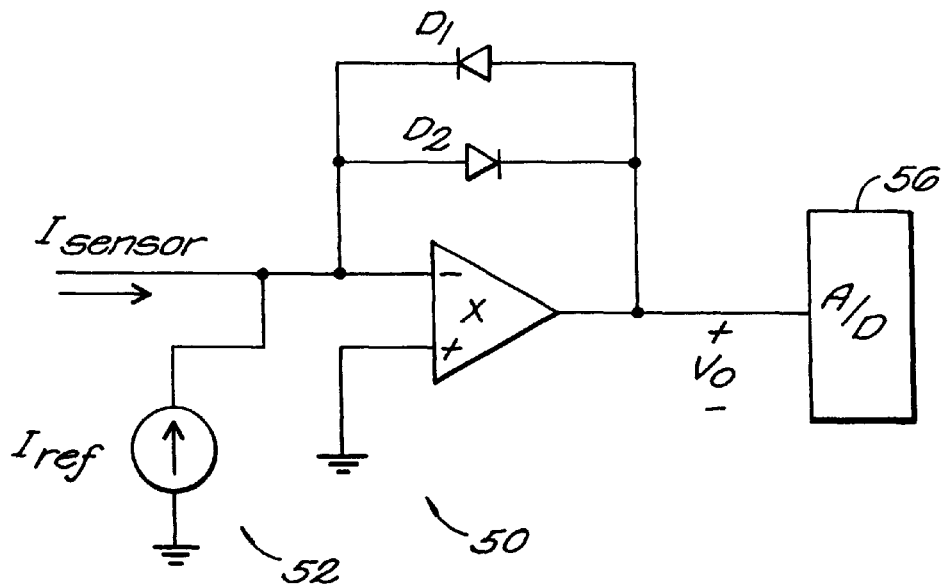
FIG. 2 is a schematic representation of the logarithmic amplifier of the present invention employing a reference calibration current $I_{ref}$.

As illustrated in FIG. 2, the present invention includes a logarithmic amplifier 50 comprising an op-amp X, for example an electrometer-grade CMOS op-amp having a low bias current on the order of 10 fA, and first and second diodes $D_1$, $D_2$. The logarithmic amplifier 50 generates an output voltage $V_o$ as a function of sensor current $I_{sensor}$ according to the exponential relationship of Equation 3 above. The present invention further includes a calibration circuit 52 for generating an accurate reference current $I_{ref}$ adjustable over a wide range of selectable levels, for example 1 pA, 10 pA, . . . , 100 μA.

Figure 3:
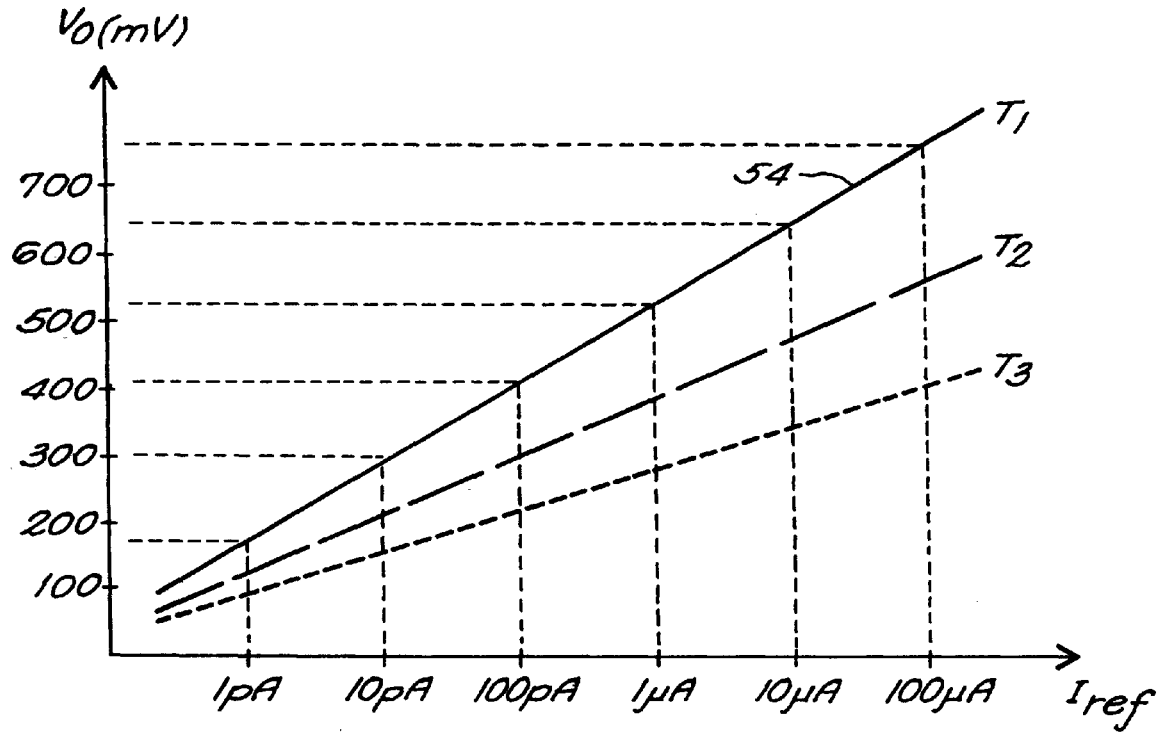
FIG. 3 is a calibration chart for the output voltage $V_o$ response of the logarithmic amplifier as a function of reference current $I_{ref}$ for a range of temperatures, in accordance with the present invention.

During a calibration sequence, the sensor current $I_{sensor}$ input 156 is disengaged and the reference current $I_{ref}$ is activated. For each applied reference current level, the corresponding output voltage $V_o$ is recorded by controlled 150 and stored in storage 152. The result is a calibration chart 54 as shown in FIG. 3, representative of the behavior of the logarithmic amplifier as a function of varying operating temperature T. The chart is stored in memory as a set of discrete data points and employed to correct sensor current readings using well-known interpolation techniques. As the operating temperature $T_1$, $T_2$, $T_3$ of the logarithmic amplifier changes, the calibration curve 54 varies accordingly. The calibration data is then used to provide both temperature-independent and accurate sensor current $I_{sensor}$ measurements. By performing temperature calibrations periodically, for example, every five minutes, or alternatively at every significant temperature change, the system can achieve accurate current measurements continuously over a range of operating conditions.

Figure 4:
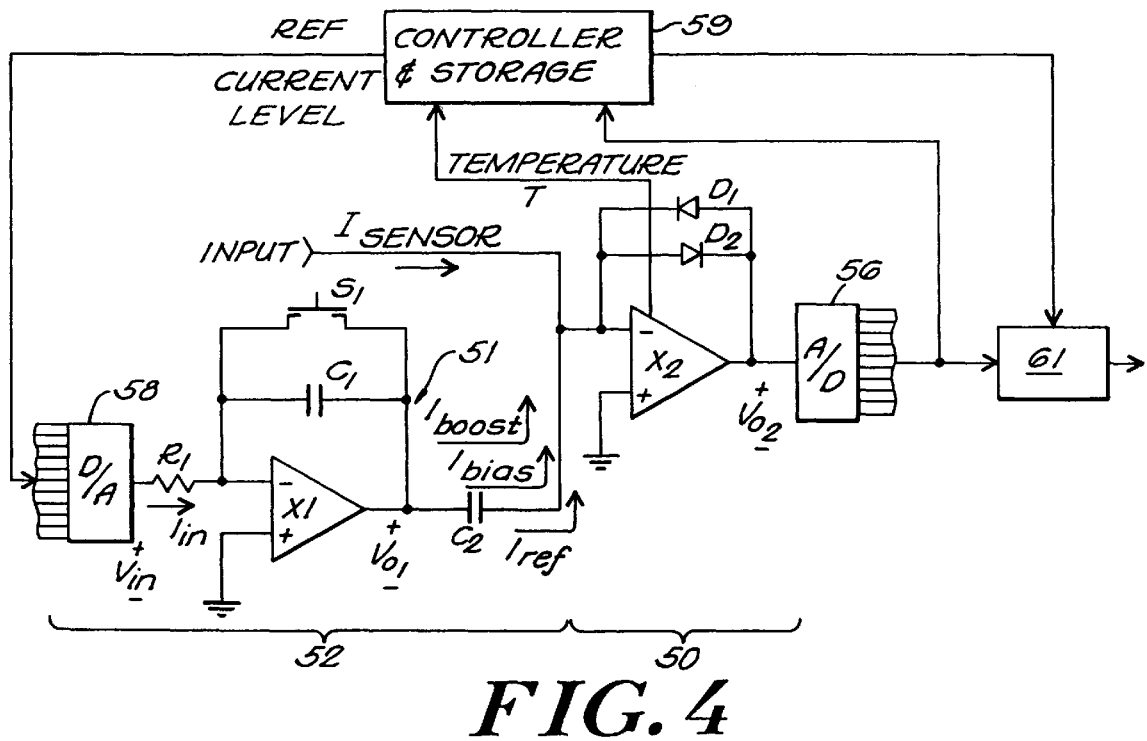
FIG. 4 illustrates the calibration circuit of the present invention for generating reference current $I_{ref}$.
Figure 5:
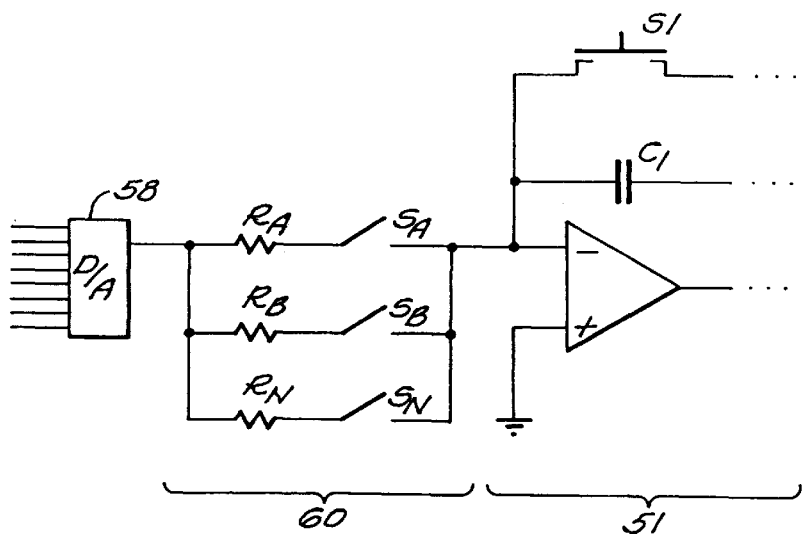
FIG. 5 illustrates an alternative means for generating an input current to the integrator amplifier in accordance with the present invention.

FIG. 4 is a schematic representation of a preferred calibration circuit 52 in accordance with the present invention. The circuit of FIG. 4 includes a standard logarithmic amplifier 50 including op-amp $X_2$ and diodes $D_1$, $D_2$. Absent the calibration circuit 52, the output voltage $V_{o2}$ of the logarithmic amplifier 50 is a function of sensor current $I_{sensor}$ provided at a sensor input. The calibration circuit 52 generates a reference current $I_{ref}$ which, as described above, is used to calibrate the logarithmic amplifier 50 to mitigate the effects of temperature sensitivity, and further, as will be described below, to provide a bias current for improving the system time response for measurement of small sensor current $I_{sensor}$ values.

In a preferred embodiment, the calibration circuit 52 includes an integrator amplifier has its input 51 formed by op-amp $X_1$, including capacitor $C_1$ as a feedback element. A selectable input voltage $V_{in}$ is accurately generated by digital-to-analog (D/A) converter 58 which is first programmable by the controller and storage 59. The input voltage $V_{in}$ is applied to resistor $R_1$ to generate an input current in which is, in turn, applied to the integrator amplifier 51. An output signal $V_{o1}$ is generated at the output of the integrator amplifier 51 in the form of a ramp voltage which is characterized by the following equation:

$$\left.\frac{dV}{dt}\right|_{V_{o1}} = \frac{I_{in}}{C_1} = \frac{V_{in}}{R_1 C_1}. \tag{4}$$

In this manner, the ramp voltage at output $V_{o1}$ is controlled by selecting the input voltage $V_{in}$ provided by D/A converter 58. The integrator amplifier 51 is periodically reset by switch $S_1$ to prevent the ramp voltage $V_{o1}$ from saturating at the level of the op-amp $X_1$ power source.

Ramp current $V_{o1}$ is, in turn, applied to capacitor $C_2$ to generate a reference current $I_{ref}$. The reference current $I_{ref}$ is given by the following relationship:

$$I_{ref} = C_2 \frac{dV_{o1}}{dt} = C_2 \frac{I_{in}}{C_1} = \frac{V_{in}}{R_1}\left(\frac{C_2}{C_1}\right). \tag{5}$$

In this manner, the reference current $I_{ref}$ is attenuated by the relationship of capacitor $C_2$ to capacitor $C_1$. For example, if $C_2$ comprises a 10 pF capacitor and $C_1$ comprises a 0.01 μf capacitor, this would result in a scaling factor of $10^{-3}$. In other words, the integrator amplifier circuit 52, including op-amp $X_1$, resistor $R_1$, capacitor $C_1$, and reset switch $S_1$, operate at a current level $I_{in}$ that is 1000 times higher than reference current $I_{ref}$. For example, to generate a 1 pA reference current $I_{ref}$, the corresponding $I_{in}$ would be 1 nA, so the leakage current in op-amp $X_1$ and reset switch $S_1$ is made negligible by the circuit configuration of the present invention. In this manner, leaky switches are placed in a non-critical portion of the device, and not in the sensitive logarithmic amplifier 50. Furthermore, since no resistor is employed in providing the reference current $I_{ref}$ to the logarithmic amplifier 50, the DC offset of op-amp $X_2$ is irrelevant in the calculations; as is the DC offset of op-amp $X_1$, since the voltage $V_{in}$ and resistor $R_1$ can be adjusted to optimize the offset voltage of $X_1$. For this reason, a resistor bank 60 including resistors $R_a$, $R_b$, $R_n$ and switches $S_a$, $S_b$, $S_n$ can be employed to increase the range of the D/A converter 58. Such a resistor bank 60 will have a minimal effect on the reference current $I_{ref}$ due to the attenuation described above.

By filtering out DC offset error through capacitor $C_2$ and by providing the reference current $I_{ref}$, DC offset in op-amp $X_2$ is minimized, and the logarithmic relationship between voltage $V_{o2}$ and sensor current $I_{sensor}$ is maintained. Since the reference current $I_{ref}$ is generated from a voltage ramp, any DC offset error generated at op-amp $X_1$ is irrelevant. In addition, the reset switch $S_1$, preferably a FET, has no adverse effects on the accuracy of the measurement, assuming a large attenuation ratio between capacitors $C_2$ and $C_1$.

When the reference current $I_{ref}$ is applied to the logarithmic amplifier 50, the relationship between $V_{o2}$ and $V_{in}$ can be described as follows:

$$V_{o2} = \frac{kT}{q}\ln\left(\frac{I_{ref}}{I_s}\right) = \frac{kT}{q}\ln\left(\frac{V_{in}}{I_s R_1}\left(\frac{C_2}{C_1}\right)\right). \tag{6}$$

In this manner, periodic calibration of the logarithmic amplifier 50 maintains the logarithmic relationship between $V_{o2}$ and the sensor current $I_{sensor}$ over a range of operating temperatures and over wide dynamic range.

Figure 6:
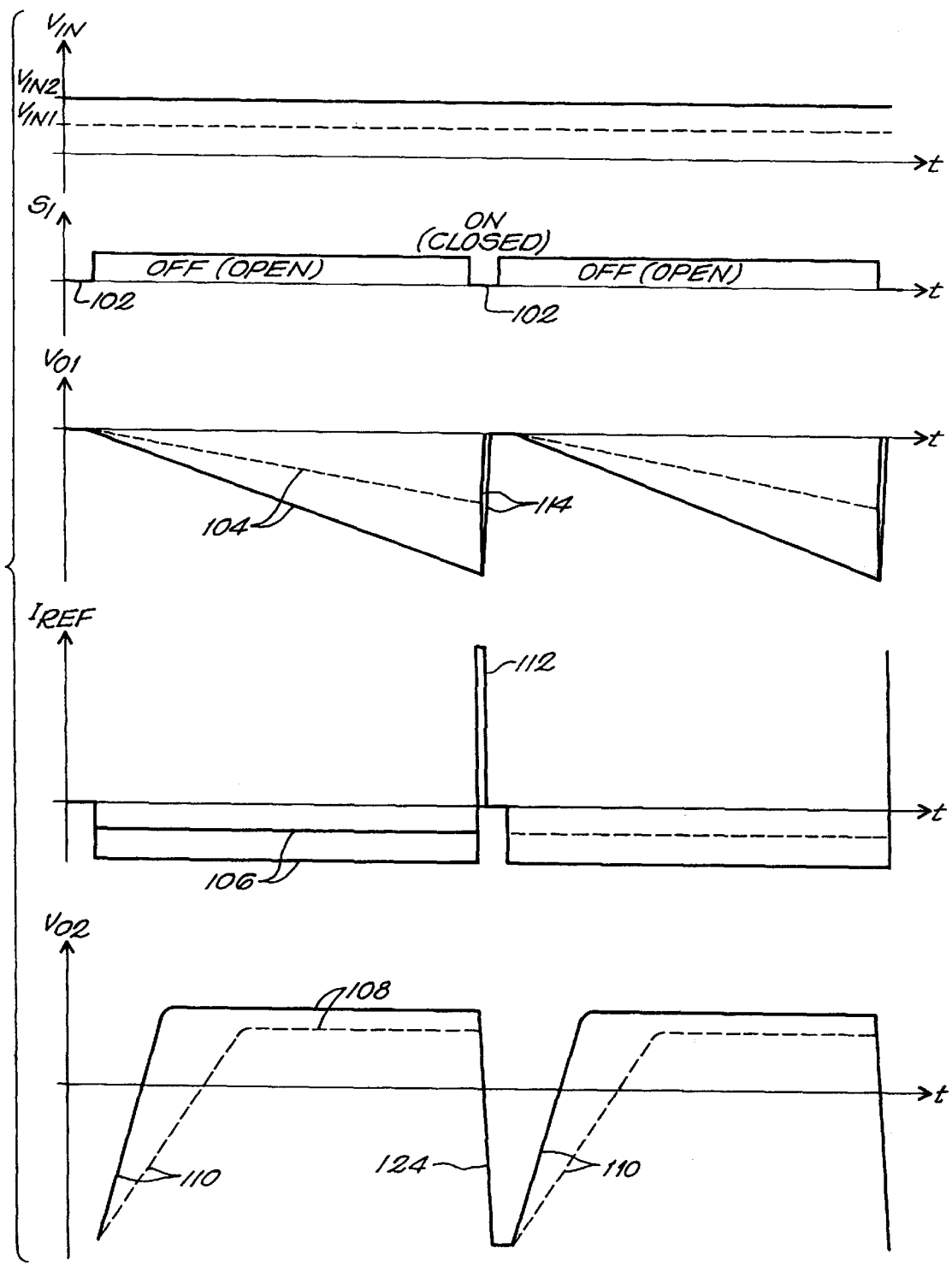
FIG. 6 is a chart illustrating the respective behavior of voltages $V_{o1}$, $V_{o2}$, and current $I_{ref}$ in accordance with the present invention.

FIG. 6 illustrates the behavior of the output voltage $V_{o1}$ of the integrator amplifier 51 (see FIG. 4) and output voltage $V_{o2}$ of the logarithmic amplifier 52 as a result of two different applied input voltages $V_{in1}$ (dashed lines) and $V_{in2}$ (solid lines). Following a periodic reset 102 of switch $S_1$, capacitor $C_1$ begins to charge, causing a ramp 104 of output voltage $V_{o1}$. Note that the slew rate of the ramp 104 is a function of applied input voltage $V_{in1}$, $V_{in2}$. As the ramp voltage $V_{o1}$ is applied to capacitor C2, a DC reference current $I_{ref}$ 106 is generated. During application of the DC reference current to the logarithmic amplifier 50, output voltage $V_{o2}$ eventually settles to a voltage level 108. The rate of settling, or slew rate 110 caused by the charging of the parasitic capacitance of the diodes $D_1$, $D_2$, is dependent on the strength of the reference current $I_{ref}$. In general, a larger applied reference current slews at a faster rate 110 and results in a higher output voltage level 108.

At the onset of a reset 102, the capacitor $C_1$ is discharged at an extremely fast rate, causing an immediate upward slope 114 in output voltage $V_{o1}$ of the integrator amplifier 52. This, in turn, causes a corresponding spike 112 in the reference current $I_{ref}$, which causes a corresponding sudden adjustment 124 in output voltage $V_{o2}$. If the adjustment 124 is large, and the applied reference current $I_{ref}$ is relatively small, then it may take considerable time for the output voltage to settle. A technique for improving the settling time will be described below.

In this manner, output voltage $V_{o1}$ operates on capacitor $C_2$ to provide an accurate reference current $I_{ref}$ for characterizing the behavior of logarithmic amplifier 50. By generating a series of reference currents $I_{ref}$, the calibration curve for the logarithmic amplifier 50 can be generated, and the system can operate accurately, independent of temperature. The reference current $I_{ref}$ is provided accurately, without the adverse impact of DC offset errors at op-amp $X_2$. Any DC offset error introduced at op-amp $X_1$ is attenuated by a factor of one thousand, assuming the ratio $C_2/C_1=1000$. Accordingly, an accurate calibration curve 54 as shown in FIG. 3 can be generated at regular periodic intervals for compensating for the temperature dependence of the logarithmic amplifier 50.

As described above, the calibration curve comprises a discrete set of measured output voltages $V_{o2}$ as a function of known applied reference currents $I_{ref}$, for example generated from a plurality of decades of reference currents $I_{ref}$, at a given temperature T. These measured output voltages $V_{o2}$ for each measured temperature T of the logarithmic amplifier 50 are stored in memory. When sensor data $I_{sensor}$ is received and processed by the logarithmic amplifier 50, an output voltage $V_{o2}$ is generated and applied, for example, to the two nearest data points on the calibration curve 54 (see FIG. 3). The corresponding current value is interpolated from the two nearest data points by the compensation device 61 and is used as the sensor current measurement $I_{sensor}$ calibrated to the present operating temperature T.

The controller and storage 59 is programmable to apply, at least one, and preferably a plurality of calibration input currents over a plurality of logarithmic decades of current levels. The controller and storage 59 stores the corresponding output voltages as a calibration chart which characterizes operation of the logarithmic amplifier at a corresponding measured temperature T, sensed from the logarithmic amplifier. The controller therefore monitors the temperature T of the logarithm. Thus, the controller monitors the temperature T of the logarithmic amplifier and, in response to a temperature change, initiates a calibration sequence by sequentially applying a plurality of known calibration input currents over a plurality of logarithmic decades of current levels and stores the corresponding calibration chart.

The present invention further confers the benefit of providing a bias current $I_{bias}$ for improving the response time of the logarithmic amplifier 50 when measuring low levels of sensor current $I_{sensor}$.

As explained above, the logarithmic amplifier 50 includes a stray parasitic capacitance inherent in the semiconductor junction of diodes $D_1$, $D_2$ (see FIG. 4). In a typical system, this stray capacitance may be on the order of 2–3 pF. State-of-the-art current measurement devices seek resolution on the order of 0.1 pA, or less. The stray capacitance (assume 3 pF) can be considered as a capacitor applied in parallel to diodes $D_1$, $D_2$. Assuming an input current of 0.1 pA applied to the logarithmic amplifier 50, it will take some time for the output voltage $V_{o2}$ to settle, due to the relatively large stray capacitance of 3 pF being charged by a relatively small 0.1 pA current. According to the logarithmic amplifier characterization curve, an input current of 0.1 pA, may correspond, for example, to an output voltage of 120 mV. Assuming that from a previous cycle, output voltage $V_{o2}$ was set at 880 mV, the circuit must slew through approximately 1 volt for output voltage $V_{o2}$ to settle at the proper voltage. With a relatively small input current of 0.1 pA and a relatively large stray capacitance of 3 pF, this results in a 30 second time constant. This can present a problem in systems which require fast response.

The present invention takes advantage of the calibration data (see FIG. 3) accurately calculated during a previous calibration sequence to provide a known bias current $I_{bias}$ which is added to the sensor current $I_{sensor}$ and applied to the logarithmic amplifier 50. The bias current $I_{bias}$ can be accurately generated by the calibration circuit 52 at a level which is an order of magnitude higher than the sensor current $I_{sensor}$ to accelerate the charging of the stray capacitance of diodes $D_1$, $D_2$. This in turn decreases the settling time of output voltage $V_{o2}$. The resulting output voltage $V_{o2}$ is applied to the calibration curve 54 to determine the combined currents of $I_{sensor}+I_{bias}$. The known bias current $I_{bias}$ is then subtracted from the combined current to give the calibrated sensor current $I_{sensor}$. As an example, assume a sensor current $I_{sensor}$ of 0.1 pA and a bias current $I_{bias}$ of 1 pA charging a stray capacitance of 3 pF across a slew of 1 volt. This would result in a response time of 3 seconds instead of 30 seconds, conferring a ten-fold improvement in response time. In a preferred embodiment, the ratio of the bias current to the sensor current can approach 100:1 to confer nearly a one hundred fold improvement in response time.

In this manner, the calibration circuit 52 is employed, not only to generate a reference current $I_{ref}$ for periodic temperature calibration of the logarithmic amplifier 50, but also to confer the additional benefit of improving the response time of the logarithmic amplifier 50 when making small sensor current $I_{sensor}$ measurements. The present invention therefore provides an improved combination of resolution, dynamic range, and response time in the logarithmic amplifier.

The controller and storage 59 is programmable for applying a bias current valve, combined with the sensor current to the logarithmic amplifier to generate a total output voltage which corresponds to the output voltage due to the combined bias current and sensor current. The controller references a total current corresponding to the total output and calculates the sensor current from the difference between the known bias current and the total current.

In an alternative embodiment, the calibration circuit further allows for selective resolution. For example, if the logarithmic amplifier of the present invention is applied to a mass spectrometer which analyzes a substance by atomic mass unit (amu), a look-up table can be provided in microprocessor memory to adjust the resolution depending on the amu of the substance being sensed. Scan speed is therefore a function of applied bias current $I_{bias}$; a faster speed reduces the resolution for amu measurements which are not critical to the scan.

Figure 7A:
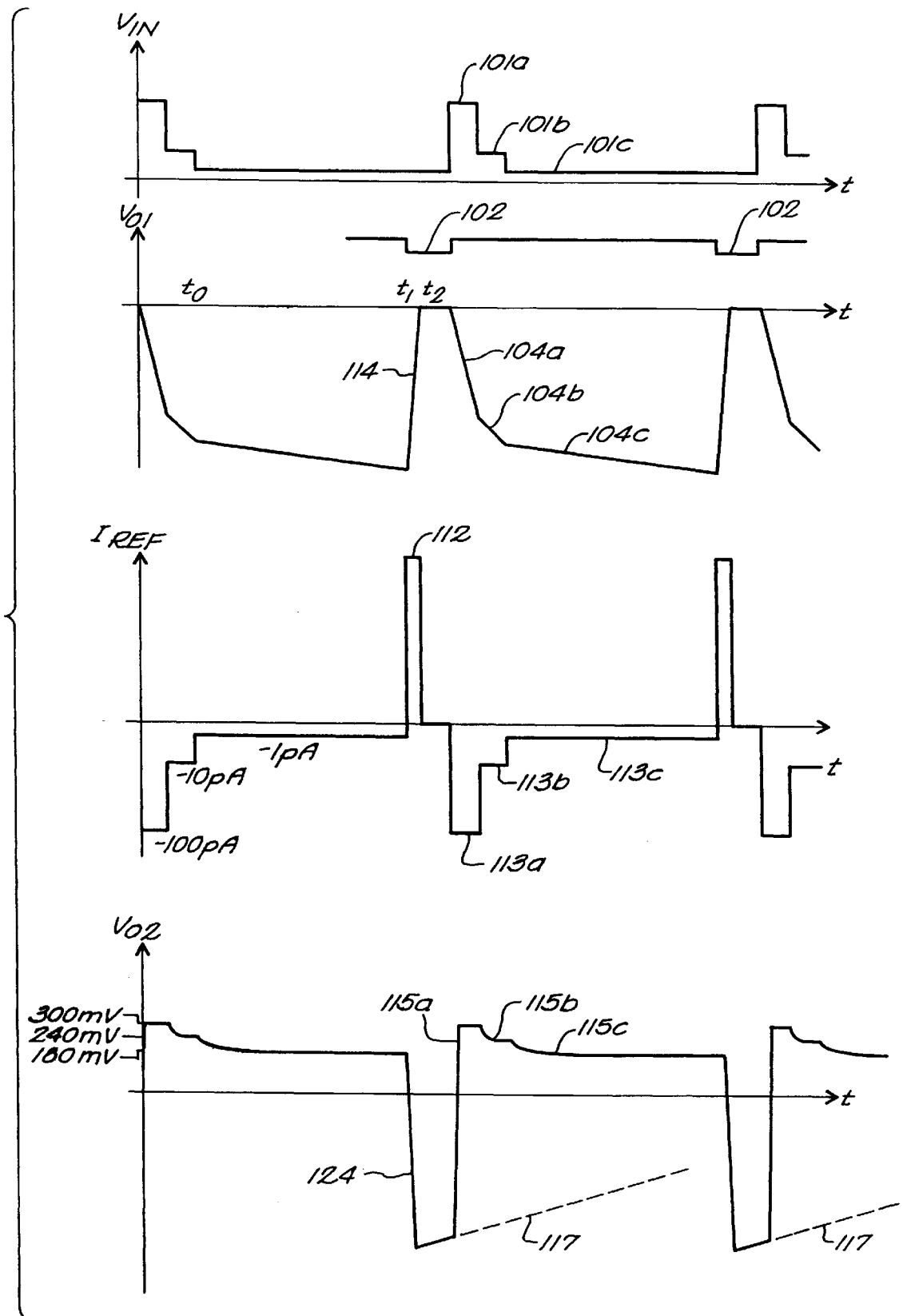
FIG. 7A is a chart illustrating the responses of output voltages $V_{o1}$, $V_{o2}$, and $I_{ref}$ as functions of time t, illustrating the application of bias current $I_{bias}$ to assist output voltage $V_{o2}$ in recovering from a spike that results during a periodic transition in $V_{o1}$ in accordance with the present invention.

FIG. 7A illustrates a further advantage conferred by the present invention. With reference to the circuit diagram of FIG. 4, during a measurement cycle beginning at time $t_o$, the voltage $V_{in}$ is set by the D/A converter 58, and consequently, voltage $V_{o2}$ ramps downward 124 as shown. At time $t_1$, the integrator amplifier 51 is reset 102 by switch $S_1$ to prevent saturation. The reset operation 102 generates a ramp 114 of a very steep positive nature between time $t_1$ and $t_2$ in output voltage $V_{o1}$. Accordingly, the resulting reference current $I_{ref}$, which, for example, was previously on the order of −1 pA from time $t_0$ to time $t_1$, undergoes a spike 112 at time $t_1$ on the order of 100–1000 μA which lasts until time $t_2$. The spike 112, in turn, results in a corresponding spike 124 in the output voltage $V_{o2}$ which could take an extremely long time to settle, for example 10 seconds, depending on the initial value of $I_{ref}$. For example, if the initial reference current $I_{ref}$ is on the order of 1 pA (corresponding to an output voltage $V_{o2}$ of 180 mV), it may take several seconds for $V_{o2}$ to settle back to its original value, as shown by dashed line 117, due to the stray capacitance in the diodes $D_1$, $D_2$ as described above.

In view of this, in a preferred embodiment of the present invention the calibration circuit 52 periodically generates a "boost" bias current $I_{boost}$ for assisting the logarithmic amplifier 50 and its corresponding output voltage $V_{o2}$ in recovering from the spike 124, thereby greatly reducing on the settling time of voltage $V_{o2}$ as a result of $V_{o1}$ being reset. The controller and storage 59 is programmable for applying a boost current to assist the apparatus in recovering from a reset sequence. The boost current $I_{boost}$ is preferably applied in selectable steps according to the chart of FIG. 8, which provides a suggested series of boost current steps, and respective durations, for a small bias current levels ranging from 1 pA to 10 nA. Application of boost current in steps causes a corresponding rapid exponential decay in output voltage $V_{o2}$. In the example of FIG. 7A, a 1 pA bias current is desired, so according to the chart of FIG. 8, following a reset operation 102, the system controller generates an input voltage $V_{in}$ step 101 a suitable for causing a −100 pA bias current step 113a for 50 msec duration. This is followed by a second applied voltage step 101b suitable for causing a −10 pA bias current step 113b for 50 msec duration; followed by application of an input voltage level 101c suitable for generating a −1 pA bias current step. This technique of application of boost current rapidly charges the parasitic capacitance of the logarithmic amplifier 50 and therefore assists the output voltage $V_{o2}$ in recovering rapidly according to corresponding exponential decay curves 115a, 115b, 115c, instead of according to decay curve 117. A sensor reading can then be taken following settling of the final step 115c with the benefit of a bias current $I_{bias}$ of −1 pA. In this manner, a large boost current $I_{boost}$ can be temporarily applied to the integrator amplifier for rapid charging of the stray capacitance during measurement of small sensor current values.

Figure 7B:
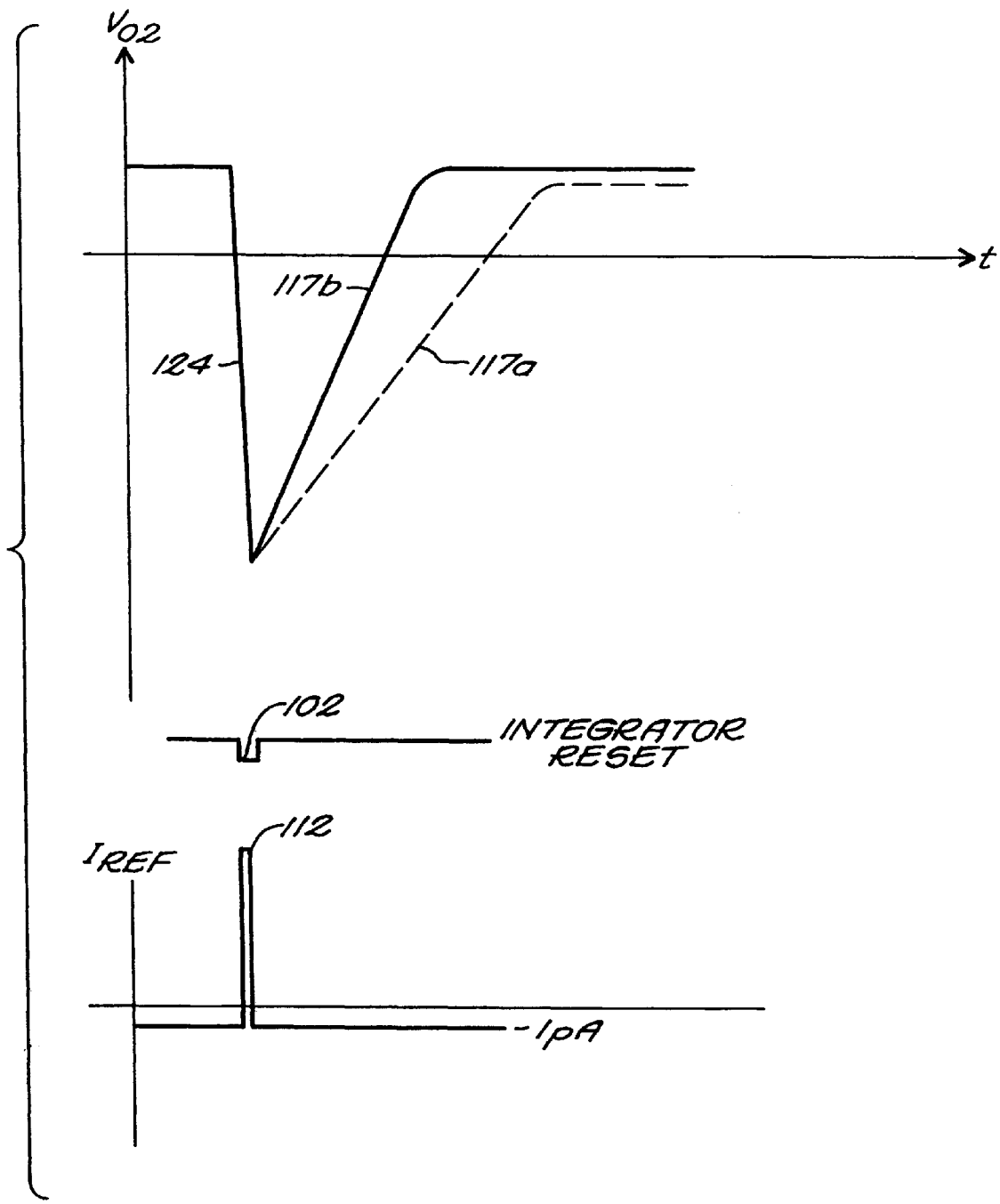
FIG. 7B illustrates the behavior of output voltage $V_{o2}$ when permitted to settle without assistance from a boost current $I_{boost}$, illustrating the effect of low levels of sensor input current on the slope of the $V_{o2}$ recovery, for fine-resolution current sensing on the order of 10 fA in accordance with the present invention.

The stray capacitance of the logarithmic amplifier 50 can be used as an advantage for measuring extremely low sensor current levels, for example, sensor currents less than 0.1 pA. With reference to FIG. 7B, assuming that the spike 124 generated in the output voltage $V_{o2}$ is permitted to settle naturally, without assistance from the additional boost current $I_{boost}$ in excess of the 1 pA bias current, as described above with reference to FIG. 7A, the resulting slope, or slew, of the recovery curve 117a is proportionally affected by the sensor input current $I_{sensor}$ to increase the slew 117b of the recovery curve. The slew rate can be detected by a fast A/D converter which periodically measures the voltage along the curve as a function of time. The difference in slew is indicative of the sensor current value. In this embodiment, a reset is provided by the arrival of current spike 112. This technique is analogous to an integrator amplifier which uses the parasitic capacitance of the diodes as a feedback capacitor. However, there is no reset switch in parallel with the parasitic capacitance, and therefore, there is no excessive leakage current associated therewith, as in the prior art. Therefore, accurate measurements at extremely low levels can be realized, for example resolution on the order of 10 fA. In this way the sensor circuit is applied to the logarithmic amplifier in combination with the calibration input circuit, and the slew rate of the corresponding output voltage is monitored such that the sensor current level is determined based on the degree of modulation that the sensor current has on the output voltage slew rate.

While this invention has been particularly shown and described with references to preferred embodiments thereof, it will be understood by those skilled in the art that various changes in form and details may be made therein without departing from the spirit and scope of the invention as defined by the appended claims.

I claim:
1. An apparatus comprising:
   a logarithmic amplifier constructed and arranged so as to generate at an output of the logarithmic amplifier an output voltage at a value logarithmically related to a reference current value received at an input of the logarithmic amplifier;
   an integrator amplifier constructed and arranged so as to generate a set of calibration references signals to the input of the logarithmic amplifier as a function of the temperature of the logarithmic amplifier, the integrator amplifier including a ramp generator that generates a ramp voltage at an output of the integrator amplifier, the ramp voltage having a rate of change that varies in accordance with an input current received at an input of the integrator amplifier; and
   a converting capacitor coupled in series between the output of the integrator amplifier and the input of the logarithmic amplifier for converting the ramp voltage to the reference current.

2. The apparatus of claim 1 further comprising current generator, coupled to the input of the integrator amplifier and constructed and arranged so as to generate the input current.

3. The apparatus of claim 2 wherein the current generator comprises a programmable voltage source in series with a resistor.

4. The apparatus of claim 3 wherein the programmable voltage source comprises a programmable digital-to-analog converter.

5. The apparatus of claim 3 further comprising a bank of resistors constructed and arranged so that the resistor can be selected from the bank.

6. The apparatus of claim 1 wherein the integrator amplifier comprises an operational amplifier and a feedback element comprising an integrator capacitor.

7. The apparatus of claim 6 further comprising a switch coupled in parallel with the integrator capacitor for periodically resetting the integrator capacitor to prevent the operational amplifier from entering a state of saturation.

8. The apparatus of claim 1 wherein the logarithmic amplifier comprises an operational amplifier and a feedback circuit comprising at least one diode.

9. The apparatus of claim 8 wherein the feedback circuit comprises a diode pair configured to permit bipolar transmission of current.

10. The apparatus of claim 1 wherein a signal representative of at least one calibration input current at a predetermined current level is applied to the input of the integrator amplifier to generate at least one corresponding output voltage at the output of the logarithmic amplifier.

11. The apparatus of claim 10 further comprising a controller constructed and arranged so as to apply the signal representation of the calibration input current and record the corresponding output voltage.

12. The apparatus of claim 11 wherein the controller is programmable to apply a plurality of calibration input currents over a plurality of logarithmic decades of current levels.

13. The apparatus of claim 11 wherein the controller stores the output voltages as a calibration chart which characterizes operation of the logarithmic amplifier at a temperature T.

14. The apparatus of claim 13 further comprising the controller is constructed and arranged so as to monitor the temperature T of the logarithmic amplifier and, in response to a temperature change, initiate a calibration sequence by sequentially applying a plurality of calibration input currents over a plurality of logarithmic decades of current levels and store the corresponding calibration chart.

15. The apparatus of claim 11 further comprising a sensor input for receiving sensor current.

16. The apparatus of claim 15 wherein the controller is programmable for applying a bias current value, combined with the sensor current, to the logarithmic amplifier to generate a total output voltage which corresponds to the output voltage due to the combined bias current and sensor current.

17. The apparatus of claim 16 wherein the controller references a total current corresponding to the total output voltage and calculates the sensor current from the difference between the known bias current and the total current.

18. The apparatus of claim 11 further comprising a reset switch for periodically resetting the integrator amplifier.

19. The apparatus of claim 18 wherein the controller is programmable for applying a boost current to assist the apparatus in recovering from a reset sequence.

20. The apparatus of claim 19 wherein the controller applies boost current in selectable steps.

21. The apparatus of claim 18 wherein a sensor current is applied to the logarithmic amplifier in combination with the calibration input current, and wherein slew rate of the corresponding output voltage is monitored such that the sensor current level is determined based on the degree of modulation that the sensor current has on the output voltage slew rate.

* * * * *